United States Patent [19]
McKee

[11] Patent Number: 5,559,331
[45] Date of Patent: Sep. 24, 1996

[54] SPLIT-RING INFRARED DETECTOR

[75] Inventor: Richard C. McKee, Glenwood, Md.

[73] Assignee: Northrop Grumman Corporation, Los Angeles, Calif.

[21] Appl. No.: 632,790

[22] Filed: Dec. 24, 1990

[51] Int. Cl.⁶ .................................................. G01J 5/28
[52] U.S. Cl. ................................ 250/338.1; 250/370.01; 250/214 R
[58] Field of Search ...................... 250/370.01, 370.08, 250/370.13, 370.14, 338.1, 211 R, 211 J; 357/30 B, 30 D, 30 Q, 30 R; 356/340, 338

[56] References Cited

U.S. PATENT DOCUMENTS

| | | | |
|---|---|---|---|
| 4,366,377 | 12/1982 | Notthoff et al. | 250/211 J |
| 4,542,295 | 9/1985 | Mattson et al. | 250/352 |
| 4,882,478 | 11/1989 | Hayashi et al. | 250/211 R |

*Primary Examiner*—Carolyn E. Fields
*Assistant Examiner*—James E. Beyer

[57] ABSTRACT

A resonant, photoconductive detector for infrared radiation in which a reduced-volume pattern of the photoconductor permits impedance-matching to free space. The photoconductor pattern is a split-ring pattern, typically made of HgCdTe, which is virtually cylindrically symmetric, yielding a non-polarization-sensitive response. The region below the patterned photoconductor is a quarter-wavelength resonant cavity type structure. The ohmic contacts are conductively distanced from one another by use of the split-ring pattern. Spacing dimensions are slightly less than a wavelength for the infrared wavelengths to be absorbed; but ring-width dimensions of the photoconductor are substantially less to effect the volume reduction and the corresponding detectivity and radiation-hardness improvements. The essentially cylindrical isotropic pattern eases fabrication by averaging etching nonuniformities.

12 Claims, 3 Drawing Sheets

SPLIT-RING INFRARED DETECTOR

BACKGROUND OF THE INVENTION

1. Field of the Invention

The present invention relates to infrared detectors and specifically infrared detectors having improved properties with regard to impedance matching and detectivity.

2. Description of the Related Art

Most prior infrared detectors have either been photoconductive, PC, or photo-voltaic, PV, detectors. For most applications, these detectors must be cooled in order to obtain the best sensitivity. PV devices, which have a high input resistance and consequently a low power consumption, are suited to a monolithic input circuit, whereas PC devices typically require so-called "off-chip" circuitry to handle the lower impedance.

There are two temperature regions where different noise sources dominate the detector's performance. These two regions are referred to as the "detector limited" and "BLIP or shot noise" regions. The detector limited temperature region, typically at relatively higher temperatures, is where detector noise dominates the ultimate performance of the device, and the dominant noise source is usually noise associated with the fluctuations in the generation and recombination rates of the current carriers in the detector, referred to as g-r noise. The BLIP temperature region, above a critical temperature, is where the fluctuations in the scene flux (the intercepted optical radiation) contribute the major portion of the detector's noise. This is also referred to as "optical g-r noise" (in PV detectors, the optical recombination noise is insignificant in relation to the optical generation noise; for this reason PV detectors have an ultimately lower noise value by one over a square root of two than that of a PC detector). The value of the critical temperature, which divides the two regions, is practically the same for both PV and PC detectors.

Recent work in PC type devices has been directed at increasing the critical temperature, which divides the two regions of operation, and at the same time, increasing the impedance of the PC detector. One reference article is by D. L. Spears, et al. "HgCdTe resonant optical cavity IR detectors", *Proceedings Of The IRIS Specialty Group On IR Detectors*, volume 2, August, 1985, page 95. The first of the two obvious advantages with this type of detector is that you can increase maximum temperature of BLIP operation of the PC device. With an increased operating temperature, many advantages appear. Several advantages are a decrease in the cooling costs and cooling systems' weight. The second obvious advantage, resulting from a higher detector impedance, is the possibility that a PC can be interfaced to a monolithic input circuit, in a manner similar to that of a PV device.

If it is possible to reduce the volume of the PC device, while still maintaining a high efficiency in capturing the IR radiation, the performance of the device can be enhanced in the detector limited region, and the critical temperature can be increased. The detectivity of the device, or D* (which is a measure of the device's performance), improves as the reciprocal of the square root of the volume of the detection material, other parameters being constant. The most recent prior work involves a polarization-sensitive, filamentous PC device. This PC has been patterned to achieve a reduction in its material volume. The patterning is done in conjunction with the formation of a resonant optical cavity beneath the patterned PC to form a structure which is impedance matched to the free space IR radiation. An "impedance matched" structure such as this, maintains a high IR radiation collection efficiency, while significantly reducing the volume of the PC. This pattern was there described as a mesh-type or multiple-filament-type pattern.

Nevertheless, there is substantial incentive for further improvements. The impedance of such a photoconductive detector still does not match the output impedance of a photovoltaic type of detector; and, moreover, the structure is typically sensitive to polarization of the incoming radiation in the sense that one polarization of the incoming radiation can be more readily detected than any other. It would be desirable to overcome these continuing disadvantages and to achieve a device with still other improved properties, such as better manufacturability.

SUMMARY OF THE INVENTION

It is an object of this invention to provide an infrared detector of improved response characteristics which is not polarization-sensitive and which has higher output impedance and improved manufacturability. More specifically, it is an object of this invention to achieve any one of the foregoing improvements of properties or, in the alternative, any desired combination thereof.

According to a preferred embodiment of the invention, an infrared detector comprises a substrate, a resonant optical cavity structure on the substrate capable, in part, of providing an impedance-matched coupling to free space for reception of infrared radiation, and a photoconductor layer which is in essence a split-ring, substantially circularly symmetrical pattern which results in impedance matching of the structure to the specific non-polarized radiation in free space.

More specifically, the resonant optical cavity structure includes a metal layer on the substrate upon which an impedance matched dielectric and the photoconductor are successively layered, with a passivating layer on top of the photoconductor to complete the optical cavity. The split-ring patterning of the photoconductor, typically mercury cadmium telluride (HgCdTe), is illustratively composed of three or four ring portions at least two of which can be so-called split-ring portions. The spacing of the split-ring portions is selected to avoid polarization dependency and to avoid reflective diffraction of the incoming radiation from the structure. The dielectric is proportioned in combination with patterning of the photoconductor to achieve the impedance matching to free space. In the patterning of the photoconductor, the photoconductive material forms a continuous path between the split-ring portions extending out to ohmic contacts at either extremity well beyond the intended pixel or unit response area of the detector. This arrangement means that a large number of such detectors can be assembled in an array without adverse affect from the ohmic contacts.

Still more specifically, the plurality of connected rings or ring portions are spaced apart a distance less than the wavelength of the radiation to be detected.

Still further, the continuity between the portions of the photoconductive material is provided by linking portions thereof which diametrically connect the plurality of rings or ring portions.

Other features and advantages will become apparent from the following detailed description taken together with the drawings.

BRIEF DESCRIPTION OF THE DRAWINGS

The accompanying drawings, which are incorporated into and constitute a part of the specification, illustrate the presently preferred apparatus and method of the invention and together with the general description given above and the detailed description of the preferred embodiment given below serve to explain the principles of the invention.

In the drawings.

DESCRIPTION OF THE PREFERRED EMBODIMENTS AND METHOD

Figure 1:
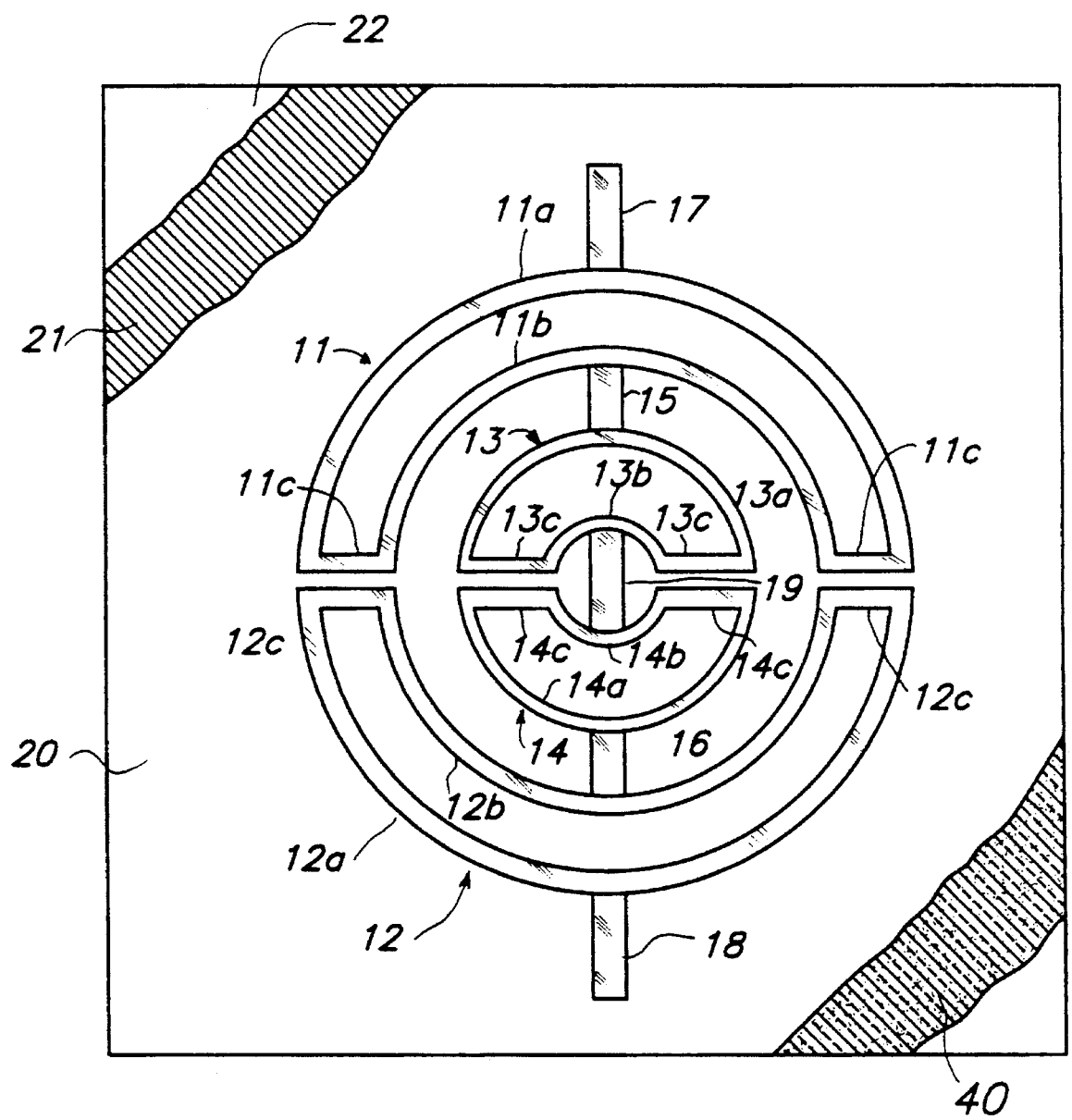
FIG. 1 is a plan view of a first embodiment of the invention employing an even number of ring portions for the photoconductor layer.

Reference will now be made in detail to the presently preferred apparatus and method incorporating the invention as illustrated in the accompanying drawings, in which like reference numerals designate like or corresponding parts throughout several drawings. In FIG. 1, reduction of the total photoconductor volume for a given area of infrared reception is achieved by the illustrated pattern of the photoconductor layer of the infrared detector. The pattern hereinafter described is supported, in succession therebelow, by a dielectric layer 20, a metal layer 21 and a substrate 22 (see FIG. 3). The pattern consists of first and second opposed split-rings 11 and 12 and third and fourth opposed split-rings 13 and 14. The first split-ring includes inner and outer curved portions 11a and 11b and cross-connecting portions 11c. Portions 11c connect inner and outer portions 11a and 11b at the split of the outer circle consisting of the outer curved portions 11a and 12a and at the split of the inner circle consisting of the inner curved portions 11b and 12b. The second split-ring 12 includes inner and outer curved portions 12a and 12b and cross-connecting portions 12c. The portions 12c connect the inner and outer curved portions 12a and 12b in a similar manner as with the first split-ring.

The third split-ring 13 includes curved portions 13a and 13b and cross-connecting portions 13c, and the fourth split-ring 14 includes curved portions 14a and 14b and cross-connecting portions 14c. The respective circles respectively comprised of curved portions 11a and 12a, 11b and 12b, 13a and 14a, and 13b and 14b are concentric one to another. In fact, although the photoconductor continuity of like cross-section consists of the portions 11a, 11b and 11c in one instance, the portions 12a, 12b and 12c in another instance, the portions 13a, 13b and 13c in another instance, portions 14a, 14b and 14c in still another instance, continuity between those portions is also provided by the heavier connecting or continuity providing portions 15, 16 and 19 as shown in the drawings.

The curved portions may be of the order of about one micrometers thick for long-wavelength infrared (8–12 micrometers) in a first instance, or may be less than one micrometer for mid-wavelength infrared (3–5 micrometers) application. The heavier connecting portions 15, 16 and 19 would be of the order of about twice as wide in cross-section. The spacing between curved portions 11a and 11b of the first split ring would typically be about 8 micrometers for long-wavelength infrared application and about three micrometers for a mid-wavelength infrared application. The spacing between the curved portions of the second, third and fourth split rings 12, 13 and 14 would be the same. The diameter of outer curved portions 11a and 12a would typically be about 56 micrometers for long-wavelength infrared operation and about 21 micrometers for mid-wavelength infrared operation. The respective spacing between first split ring 11 and the third split ring 13 and between the second split ring 12 and the fourth split ring 14 is about 8 micrometers for long-wavelength infrared applications and about 3 micrometers for mid-wavelength infrared applications. Long-wavelength infrared is approximately in the range of 8 to 12 micrometers, and mid-range of mid-wavelength infrared is approximately in the range of 3 to 5 micrometers. For short-wavelength infrared application, infrared wavelengths are between about 3 micrometers and about seven-tenths of a micrometer. For applications in the latter case, the lateral dimensions would be correspondingly less.

It is therefore seen that the adjacent-element spacings in the split-ring configuration of FIG. 1 are in every case of the order, or a little less than, of a wavelength of the infrared radiation to be detected. Therefore, effective absorption can be achieved at the same time that the actual volume of material employed is greatly reduced as compared to prior infrared radiation detectors.

The operation of the embodiment of FIG. 1 can best be understood by considering the following for a detector for which the performance is largely limited by the noise of photogeneration and recombination. The detectivity, D, commonly called D-Star, improves (in the detector limited temperature regions) as the reciprocal of the square root of the volume, that is, the actual volume, of the detector material. Thus, a factor of 10 reduction in volume results in a 3.3 factor increase in D*. Performance improvements have been demonstrated in every case in which the volume of the pattern material can be reduced. Nevertheless, it is surprising the extent to which the split-ring configuration of FIG. 1 enables the reduction of the volume of the photoconductor material for a given pixel size for reception and absorption of infrared radiation. In the case of FIG. 1, the pixel size relates primarily to the overall diametrical dimension which is 56 micrometers for long-wavelength application and 21 micrometers for mid-wavelength application. Moreover, the configuration of FIG. 1 offers other significant improvements over the patterned photoconductor of the prior art. These improvements include not only higher detectivity but higher overall resistance yielding a higher output impedance because of the effective increased length of the conductive path in the photoconductor, reduced so-called diffuse-out sweep-out effects, a reduction in etching non-uniformities during fabrication of the device and a radiation-hard device.

The improvement in etching capabilities and resultant properties results from the fact that there are fewer sharp corners and steep sidewall requirements for the etching of the embodiment of FIG. 1 than for the prior patterned structure and the essentially cylindrical symmetry will tend to average etching nonuniformities. Still further, the embodiment of FIG. 1 does not discriminate between the right circularly polarized infrared radiation to be detected and the left circularly polarized infrared radiation. Moreover, the embodiment achieves the advantage of having the ohmic electrical connections at the outer limits of portions 17 and 18, relatively removed from the detection region as compared with the prior patterned structure.

Figure 2:
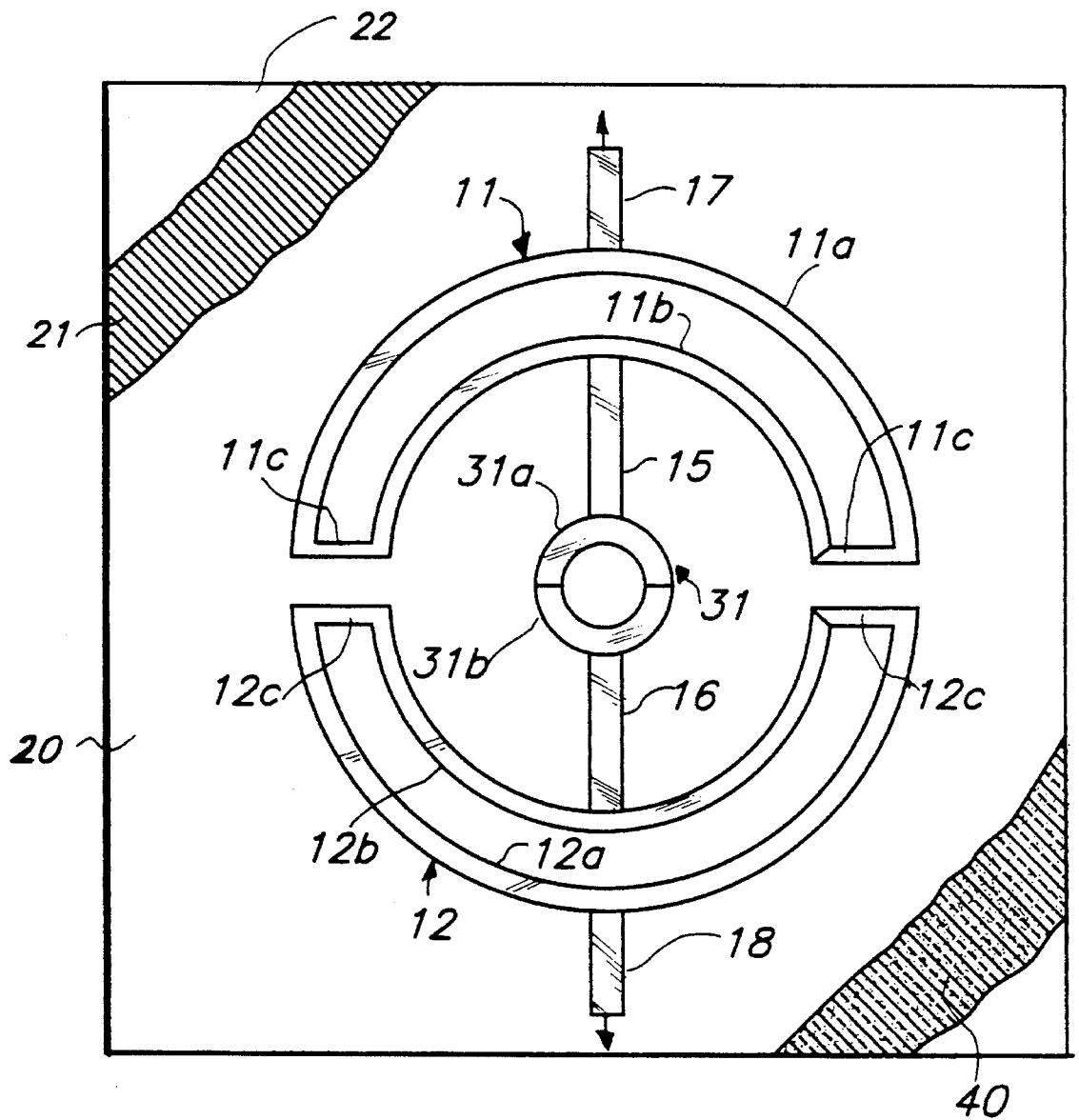
FIG. 2 is a plan view of a second embodiment of the invention employing an odd number of ring portions for the photoconductor layer.

In the embodiment of FIG. 2, the pattern of the photoconductor layer is similar to that of the embodiment of FIG.

1 except that there are an odd number of curved portions resulting in an innermost portion 13 which is completely circular. The third or inner ring 31 is comprised of the photoconductor portions 31a and 31b and the remainder of the structure is essentially like that of FIG. 1, except for the lack of portions 13 and 14 and the middle connecting link 19. The first and second split-rings 11 and 12 are structured the same as above described for the embodiment of FIG. 1. The pattern is likewise supported by dielectric 20, metal layer 21 and substrate 22 (see FIG. 3).

In the embodiment of FIG. 2 curved portions may be of the order of about one micrometer wide for long wavelength infrared (8–12 micrometers) and may be less than one micrometer for mid-wavelength infrared (3–5 micrometers) application. The connecting portions 15 and 16 would be about two micrometers wide. The diameter of the outer curved portions 11a and 12a which represents the pixel size would typically be about 40 micrometers for long-wavelength infrared operation and about 15 micrometers for mid-wavelength infrared operation.

It is seen that detectors of any number of rings can be created based on the arrangements and principles of FIG. 1 and FIG. 2. Furthermore, it is apparent that these rings are spaced apart radially at distances slightly less than the wavelength of the radiation to be detected, yielding an internal diffraction effect for the radiation. The optimum photoconductor material for long-wave infrared detection is mercury cadmium telluride (HdCdTe) (either HgCdTe or InSb could be used for mid-wavelength infrared application). Typically the dopant level of the long-wavelength infrared photoconductive, p-type mercury cadmium telluride is approximately, to slightly below, $10^{16}$ atoms/cm$^3$. Generally, defect doping is the dominant electrically active acceptor, but other impurity acceptor types such as Ag and Cu are being studied.

Figure 3:
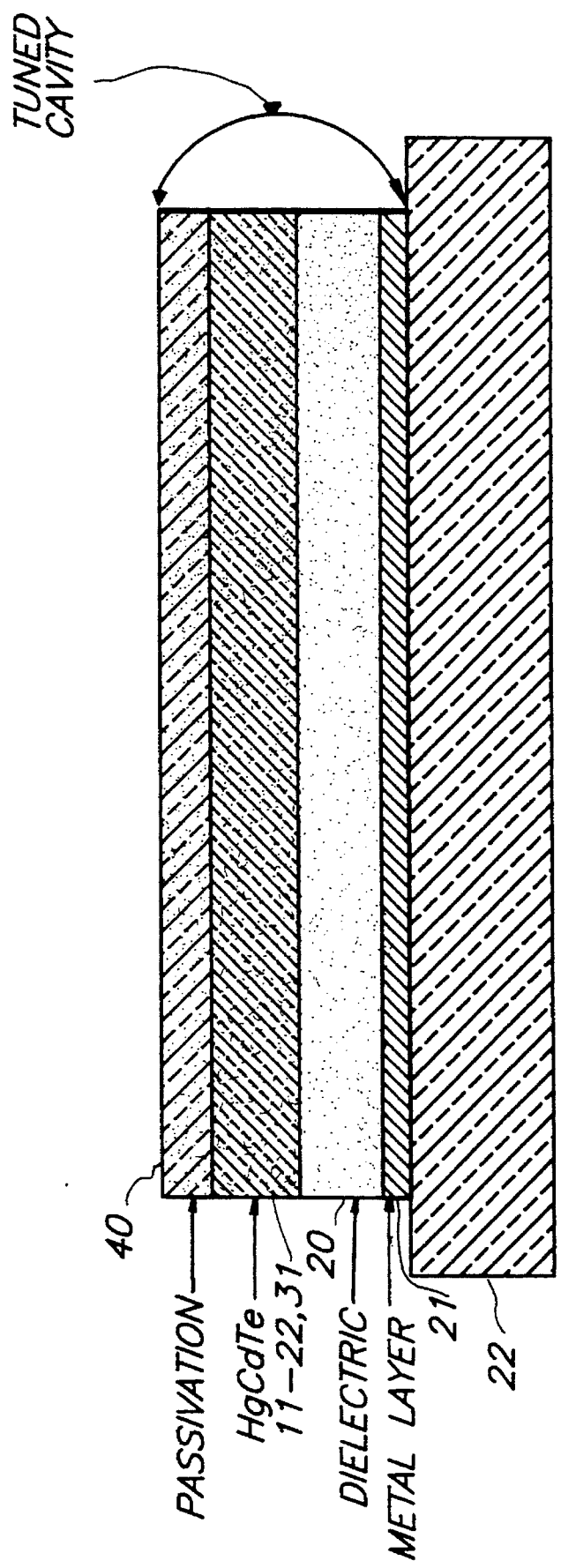
FIG. 3 is an elevational view in cross-section through a continuous path of the photoconductor of either of the embodiments of FIGS. 1 and 2.

The elevational structure of both the embodiments of FIG. 1 and FIG. 2 is illustrated in FIG. 3. The resonant optical cavity structure employed with the split-ring structure of the invention is shown here. It will be seen that with the combination of these elements including the spacing of the split-ring structures to enable the device to act like a diffraction grating and a better impedance match to free space, there are no reflected diffracted modes outside of the device and yet the diffraction effects internally enable efficient absorption in the resonant optical structure.

In FIG. 3 the cross-section shows that the mounting substrate 22 which preferably can be cadmium telluride (CdTe). The cadmium telluride substrate 22 could, however, be replaced with any other dielectric substrate of sufficient supporting properties and suitably wide band gap. The metal layer 21 is positioned over the substrate 22 and is an essential part of the resonant optical cavity. The metal layer can be chromium, for example. The matched dielectric layer 20 is a separate layer of cadmium telluride that could also be cadmium zinc telluride, zinc sulfide, silicon dioxide, silicon nitride or such other similar dielectric material. In each case the thickness of dielectric layer 20 is selected dependent on the specific index of refraction and properties of the material. A mercury cadmium telluride pattern structure 11–22, 31 is then disposed on top of the dielectric layer 20 over the entire structure. A passivation layer 40 for passivating the pattern of photoconductor is then deposited over the entire structure. The p-type ohmic contacts at the ends of the connecting portions 17 and 18 are illustratively formed of gold.

There are clearly many alternative materials suitable for layers 20, 21 and 22 and for the passivation layer 40. The photoconductor material need not be mercury cadmium telluride if a suitable alternative material for a particular wavelength range is selected. Nevertheless, in all cases the split-ring pattern structure and resonant optical cavity principles of the present invention would be employed.

The operation of the structure of the invention with respect to the resonant optical cavity can best be understood as follows. The spacing of the split-ring elements is selected for the infrared range of radiation being detected and enables the device to act like a diffraction grating internally resulting in an evanescent reflected type of mode externally so that there is no significant external diffracted pattern. There are diffracted modes present in the dielectric layer and the photoconductor pattern in the resonant optical cavity below the photoconductor passivation layer 40. The dielectric thickness, that is the thickness of layer 20 is tuned to one quarter wavelength to make the amplitude of the reflected, diffracted mode vanish. In the configuration of the embodiment as shown in FIGS. 1 or 2 and 3 the ring spacing along with the HgCdTe and dielectric dimensions are important design parameters since a larger spacing results in externally reflected (lost) diffracted radiation and therefore lower absorption; and a smaller spacing adds more volume of HgCdTe and lowers responsivity and D*. An advantage in this case is that the split-ring photoconductor pattern is impedance matched for both left and right circularly polarized components of input radiation and detects non-polarized radiation.

Moreover, because of the design illustrated in FIGS. 1 and 2, the photoconductor path length is much longer than one side dimension of the pixel or intended area of reception for the infrared radiation. For instance the path length in FIG. 1 for a structure dimensioned for long wavelength infrared detection the path length is typically 232 µ long. This length gives the configuration of FIGS. 1 and 2 two additional advantages over prior detectors, namely, higher resistance and lower contact diffuse out/sweep out effects. These improvements are theoretically quantified for typical detectors in Table 1.

Table 1 below compares four HgCdTe detector configurations. These devices are a conventional photoconductor, a prior art filament patterned type detector and the two split-ring infrared radiation detectors of the present invention as embodied in FIGS. 1 and 2. All four designs use the same HgCdTe starting material, passivation and contacts. Thus, all four detector designs have the same mobility, lifetime, carrier concentrations, surface recombination velocity and ohmic contact recombination velocities.

The comparisons shown in Table 1 separate the material properties from the detector design for meaningful device comparisons. For a thermal generation-recombination (g-r) limited D*, D* is proportional to $$(\tau eff/V)^{+e_{fra}\ 1/2}+ee,$$

where $\tau_{\mathit{eff}}$ is the effective minority carrier lifetime and V is the volume of the detector. Thus, a reduction in the volume or improvement in the lifetime yields a detector with better performance. The surface effects and ohmic contact effects are incorporated into $\tau_{\mathit{eff}}$.

$$\tau_{\mathit{eff}}=\{2Sy/w+2Sz/d+(Zeta*\tau_{bulk})^{-1}\}^{-1}$$

where w,d are the detector's width and depth Sy and Sz are the surface recombination velocities at the y and z passivation surfaces, $\tau_{bulk}$ is the bulk minority carrier lifetime, and Zeta is the function which incorporates the diffuse/sweepout effects of the ohmic contacts.

For conventional detectors, the passivated surfaces have less impact on the lifetime, but the ohmic contacts can significantly reduce the lifetime. Conventional detectors typically have their lifetimes reduced directly by the value of the Zeta function. The lower the Zeta function, the poorer is the lifetime.

readily adapted to different numbers of split-rings on account of the lack of closely spaced fine detail. It will readily occur to those skilled in the art that still further modifications and advantages can be achieved, consistent with the above-described principles, without departing from the spirit and scope of the invention. It is intended that the specification and examples will be considered as exemplary only with a true scope and spirit of the invention being indicated by the following claims and their equivalents.

TABLE 1

| 4 RING (FIG. 1) | 3 RING (FIG. 2) | PRIOR ART | CONVENTIONAL | |
|---|---|---|---|---|
| 57 u(ROUND) | 40 u(ROUND) | 48 u × 48 u | 50 u × 50 u | PIXEL SIZE |
| 1 u | 1 u | 1 u | 10 u | THICKNESS |
| 255 u$^2$ | 1257 u$^2$ | 2304 u$^2$ | 2500 u$^2$ | PIXEL AREA |
| 463 u$^2$/463 u$^3$ | 274 u$^2$/274 u$^3$ | 350 u$^2$/350 u$^3$ | 2500 u$^2$/50,000 u$^3$ | ACTIVE AREA/VOLUME |
| 232 u | 137 u | 100 u | 100 u | PATH LENGTH BETWEEN CONTACTS (FOR ZETA) |
| 8.13 | 3.43 | 2 | 2 | PATH LENGTH PIXEL LENGTH RATIO |
| 118 | 68.5 | 14.3 | .2 | # OF 1 u THICK SQUARES |
| 463 u$^2$/463 u$^3$ | 274 u$^2$/274 u$^3$ | 700 u$^2$/700 u$^3$ | 5000 u$^2$/50,000 u$^3$ | TOTAL PHOTO-CONDUCTOR AREA/VOLUME |
| .018 | .022 | .030 | 1 | PHOTOCONDUCTOR MATERIAL VOL./ CONV. DET VOL. RATIO |

(u = micrometers)

In Table 1 the various dimensions of the four HgCdTe designs are compared. The comparisons show the significant decreases in volume and increases in resistance which can be achieved using the split-ring detector of the present invention. For the embodiment of FIG. 1, there are 118 one micrometer thick squares as compared to the prior filament patterned detector which has 14.3 one micrometer thick squares. This translates to a 8.25 increase in resistance (118/14.3). Also the detector volume, comparing the same two detectors, is reduced by a factor of 0.6, i.e., (0.018/0.03).

With respect to radiation hardness, this improved property can be appreciated from the fact that the radiation hardness is a function of cross-section and thickness for gamma type radiation, the hardness being greater when the cross-section and thickness are lower. The cross-section of the new configuration for gamma radiation is lower than in any prior configuration since it has a lower volume of photoconductive material for a given pixel size.

The $\tau_{eff}$ and Zeta functions for the two split-ring detectors of FIGS. 1 and 2 are improved over prior devices. Generally, since the conduction path distance between the contacts has been increased, the Zeta function is higher for devices according to this invention than for other designs having the same material parameters.

In comparing D* improvements over prior devices, it is well to note that D* is improved by a factor of two on account of the detector being non-polarized. Additional improvements are achieved because of the extra length between contacts and the reduced volume of photoconductor material.

It will be apparent to those skilled in the art that various modifications and variations can be made in the infrared detector of the present invention according to the principles above described and that the method of construction can be

What is claimed is:

1. A detector for infrared radiation, comprising:

a substrate; and a substantially resonant optical cavity structure on said substrate, said structure including:

a reflector positioned on the substrate;

a dielectric layer on said reflector; and a patterned infrared photoconductor on the dielectric layer and having opposed to said dielectric layer a surface region providing substantial reflectivity for said infrared radiation, said optical cavity structure being proportioned to yield an evanescent external reflected order of said infrared radiation, said patterned infrared photoconductor being arranged in a plurality of split-ring portions having concentric semicircular portions having end portions which are connected by cross-connecting portions for substantially equivalent response to two different polarization components, the spacing of the semicircular portions being selected to enhance the absorption of the infrared radiation in the photoconductor.

2. The detector of claim 1, in which the spacing of the semi-circular portions is less than the shortest wavelength to be detected.

3. The detector of claim 1, in which the plurality of split-ring portions include pairs of split-ring portions which are connected diametrically by continuity providing portions.

4. The detector of claim 1, in which the photoconductor includes continuity providing portions that link concentric, evenly-spaced pairs of split-ring portions, said split-ring portions and said continuity providing portions having widths parallel to the reflector that are approximately an order of magnitude less than a mid-range infrared wavelength of the infrared radiation to be detected.

5. The detector of claim 4, in which the photoconductor includes secondary continuity providing portions that diametrically link the linked pairs of split-ring portions, the secondary continuity providing portions being substantially wider than the cross-connecting portions to facilitate external connectivity of the detector.

6. The detector of claim 4, in which the concentric split-ring portions of the photoconductor and the cross-connecting portions of the photoconductor have a width of approximately one micrometer, whereby the detector is adapted for detecting infrared radiation in the 8–12 micrometer range.

7. The detector of claim 4, in which the concentric split-ring portions of the photoconductor and the cross-connecting portions of the photoconductor have a width of less than one micrometer, whereby the detector is adapted for detecting infrared radiation in the 3–5 micrometer range.

8. The detector of claim 5, in which the closest diametrical spacing of the diametrically linked split-ring portions substantially equals the spacing of the cross-connected concentric evenly-spaced portions to provide a diffraction effect within the substantially resonant optical cavity structure, whereby the absorption of the infrared radiation by the photoconductor is increased.

9. The detector of claim 1 in which the plurality of split-ring portions lie on an even number of concentric circles.

10. The detector of claim 1 in which the plurality of split-ring portions lie on an odd number of concentric circles.

11. A detector for infrared radiation, comprising a substrate of cadmium telluride or cadmium zinc telluride;

a metal layer on said substrate;

a matched dielectric layer of cadmium telluride, cadmium zinc telluride, zinc sulfide, silicon dioxide or silicon nitride on said metal layer; and a multiple split-ring pattern of mercury cadmium telluride or indium antimonide on said matched dielectric layer, said pattern including multiple concentric portions of which evenly-spaced, nearby-portions are cross-connected in a non-polarization-sensitive pattern to reduce the volume of said pattern; said pattern having a surface remote from said matched dielectric layer of providing substantial reflectivity.

12. The detector of claim 11, in which the split-ring pattern provides an evanescent external reflected wave, the metal layer, the layer on the metal layer and the pattern, including the remote surface thereof, being proportioned to provide a diffracted mode with the detector excited by the infrared radiation to be detected.

* * * * *